United States Patent
Pyon et al.

(10) Patent No.: US 10,121,803 B2
(45) Date of Patent: Nov. 6, 2018

(54) SEMICONDUCTOR DEVICE HAVING AUXILIARY PATTERNS

(71) Applicant: Samsung Display Co., Ltd., Yongin-si, Gyeonggi-do (KR)

(72) Inventors: Chang-Soo Pyon, Yongin-si (KR); Min-Ho Ko, Yongin-si (KR); Hyun-Chol Bang, Yongin-si (KR); Kwang-Min Kim, Yongin-si (KR); Won-Kyu Kwak, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 15/600,330

(22) Filed: May 19, 2017

(65) Prior Publication Data

US 2017/0256566 A1  Sep. 7, 2017

Related U.S. Application Data

(62) Division of application No. 13/590,079, filed on Aug. 20, 2012, now Pat. No. 9,659,970.

(30) Foreign Application Priority Data

May 7, 2012  (KR) .................. 10-2012-0048086

(51) Int. Cl.
*H01L 29/00* (2006.01)
*H01L 27/12* (2006.01)
(Continued)

(52) U.S. Cl.
CPC ........ *H01L 27/124* (2013.01); *H01L 23/5223* (2013.01); *H01L 27/1255* (2013.01); *H01L 28/40* (2013.01)

(58) Field of Classification Search
CPC . H01L 28/40; H01L 23/5222; H01L 23/5223; H01L 27/124; H01L 27/1255
(Continued)

(56) References Cited

U.S. PATENT DOCUMENTS 6,323,490 B1 * 11/2001 Ikeda ................ H01L 27/14659
250/370.07
7,564,089 B2 * 7/2009 Yamazaki ......... H01L 27/11502
257/306
(Continued)

FOREIGN PATENT DOCUMENTS

CN        101179084 A    5/2008
CN        101243481 A    8/2008
(Continued)

OTHER PUBLICATIONS

Korean Patent Abstracts, Publication No. 1020050104605 A, dated Nov. 3, 2005, for corresponding Korean Patent 10-0637432.
(Continued)

*Primary Examiner* — Matthew E Warren
(74) *Attorney, Agent, or Firm* — Lewis Roca Rothgerber Christie LLP

(57) ABSTRACT

A semiconductor device includes a substrate, a first conductive layer on the substrate and including a main pattern, and substantially symmetrical auxiliary patterns extending from two sides of the main pattern, an insulating layer on the substrate and the first conductive layer, and a second conductive layer on the insulating layer and overlapping at least a portion of the main pattern and the auxiliary patterns.

6 Claims, 4 Drawing Sheets

(51) Int. Cl.
*H01L 23/522* (2006.01)
*H01L 49/02* (2006.01)

(58) Field of Classification Search
USPC ........................................ 257/532, 534, 535
See application file for complete search history.

(56) References Cited

U.S. PATENT DOCUMENTS

| | | |
|---|---|---|
| 2005/0184324 A1 | 8/2005 | Wu et al. |
| 2008/0157275 A1 | 7/2008 | Imamura |
| 2009/0050889 A1 | 2/2009 | Chien et al. |
| 2009/0251615 A1 | 10/2009 | Tsubata |
| 2010/0001286 A1 | 1/2010 | Chien et al. |

FOREIGN PATENT DOCUMENTS

| | | |
|---|---|---|
| JP | 7-326764 | 12/1995 |
| JP | 2005-277350 A | 10/2005 |
| JP | 2007-258675 A | 10/2007 |
| KR | 10-2004-0034189 | 4/2004 |
| KR | 10-2005-0104603 A | 11/2005 |
| KR | 10-2005-0110944 A | 11/2005 |
| KR | 10-2005-0122699 A | 12/2005 |
| KR | 10-2006-0082827 | 7/2006 |
| KR | 10-0637432 | 10/2006 |
| KR | 10-0641935 | 11/2006 |
| KR | 10-2007-0117079 | 12/2007 |
| KR | 10-0896167 | 5/2009 |
| KR | 10-1056233 | 8/2011 |
| KR | 10-2008-0085411 | 2/2014 |

OTHER PUBLICATIONS

Korean Patent Abstracts, Publication No. 1020050119432 A, dated Dec. 21, 2005, for corresponding Korean Patent 10-0641935.
Taiwan Office Action dated Jan. 20, 2016 in connection with Taiwan Patent Application No. 101132973, 5 pages.
SIPO Office Action dated Nov. 30, 2016, with English Translation, for corresponding Chinese Patent Application No. 201210357013.5 (16 pages).

* cited by examiner

SEMICONDUCTOR DEVICE HAVING AUXILIARY PATTERNS

CROSS-REFERENCE TO RELATED APPLICATION

This application is a divisional of U.S. patent application Ser. No. 13/590,079, filed Aug. 20, 2012, which claims priority to and the benefit of Korean Patent Application No. 10-2012-0048086, filed on May 7, 2012, in the Korean Intellectual Property Office, the entire contents of both of which are incorporated herein by reference.

BACKGROUND

1. Field

Embodiments of the present invention relate to a semiconductor device.

2. Description of the Related Art

A semiconductor device includes a thin film transistor, a capacitor, and/or the like, which may include at least two conductive layers used as an active layer or an electrode. The conductive layer is patterned through a lithography process and an etching process during manufacturing. In the lithography process, a photoresist pattern is formed by an exposure process and a development process using a mask, and in the etching process, the conductive layer has a pattern formed using the photoresist pattern.

The two conductive layers of the thin film transistor and the capacitor are located at upper and lower portions, respectively, and should overlap each other (at least partially). However, an area at which the upper conductive layer overlaps the lower conductive layer may decrease due to misalignment during a process of patterning the upper conductive layer. When the area at which the two conductive layers overlap decreases, capacitance between the upper and lower conductive layers decreases, and electrical characteristics relating thereto are changed.

When capacitance of a storage capacitor included in a pixel circuit decreases (e.g., in a liquid crystal display device, or an organic light emitting display device), a current driving the pixel is changed, such that uniformity of color is deteriorated, and a spot of a low gray-level may be generated, thereby deteriorating quality of a display panel of the device.

SUMMARY

An aspect of embodiments of the present invention is to provide a semiconductor device having electrical characteristics that are relatively unchanged despite misalignment.

Another aspect of embodiments of the present invention is to provide a semiconductor device for improving quality of a display panel.

According to an exemplary embodiment of the present invention, there is provided a semiconductor device including a substrate, a first conductive layer on the substrate and including a main pattern, and substantially symmetrical auxiliary patterns extending from two sides of the main pattern, an insulating layer on the substrate and the first conductive layer, and a second conductive layer on the insulating layer and overlapping at least a portion of the main pattern and the auxiliary patterns.

At least one of the auxiliary patterns may be coupled to a wiring.

At least one of the first conductive layer or the second conductive layer may include a semiconductor layer.

At least one of the first conductive layer or the second conductive layer may include a metal layer.

The semiconductor device may include a thin film transistor.

The semiconductor device may include a capacitor.

According to another exemplary embodiment of the present invention, there is provided a semiconductor device including a substrate, a first conductive layer on the substrate and including a main pattern, substantially symmetrical first auxiliary patterns extending from two sides of the main pattern, and substantially symmetrical second auxiliary patterns extending from two other sides of the main pattern, an insulating layer on the substrate and the first conductive layer, and a second conductive layer on the insulating layer and overlapping at least a portion of the main pattern, the first auxiliary patterns, and the second auxiliary patterns.

At least one of the first conductive layer or the second conductive layer may include a semiconductor layer.

At least one of the first conductive layer or the second conductive layer may include a metal layer.

The semiconductor device may include a thin film transistor.

The semiconductor device may include a capacitor.

BRIEF DESCRIPTION OF THE DRAWINGS

The accompanying drawings, together with the specification, illustrate exemplary embodiments of the present invention, and, together with the description, serve to explain the aspects of embodiments of the present invention.

DETAILED DESCRIPTION

Figure 1A:
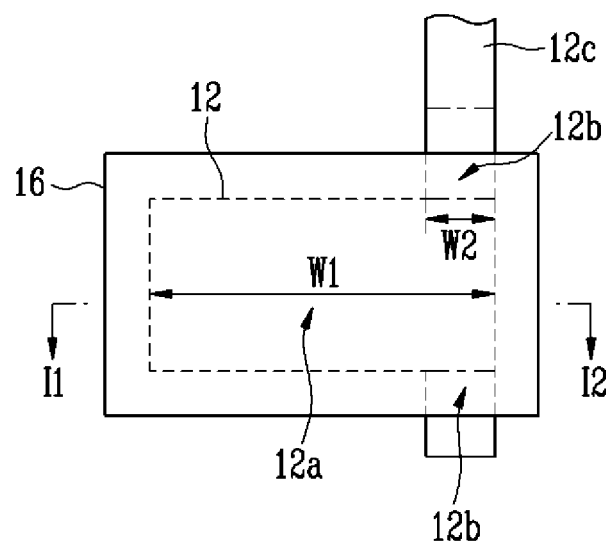
FIG. 1A is a plan view describing a semiconductor device according to an exemplary embodiment of the present invention.

Hereinafter, certain exemplary embodiments according to the present invention will be described with reference to the accompanying drawings. Here, when a first element is described as being coupled to a second element, the first element may be directly coupled to the second element or may be indirectly coupled to the second element via one or more other elements. Further, some of the elements that are not essential to the complete understanding of the invention are omitted for clarity. Also, like reference numerals refer to like elements throughout.

Hereinafter, exemplary embodiments of the present invention will be described in detail with reference to the accompanying drawings. The following exemplary embodiments of the present invention may be modified in many different forms so that those skilled in the art may easily implement the spirit of the present invention, and the scope of the present invention should not be limited to the embodiments described below.

Figure 1B:
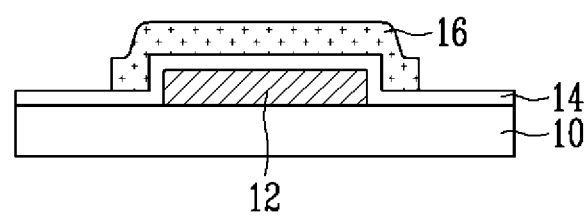
FIG. 1B is a cross-sectional view taken along the line I1-I2 of FIG. 1A.

FIG. 1A is a plan view describing a semiconductor device according to an exemplary embodiment of the present invention, and FIG. 1B is a cross-sectional view taken along the line I1-I2 of FIG. 1A. Referring to FIGS. 1A and 1B, the semiconductor device includes a first conductive layer 12, an insulating layer 14, and a second conductive layer 16.

The first conductive layer 12 is formed on a substrate 10 and includes a main pattern 12a and auxiliary patterns 12b extended from at least two sides of the main pattern 12a and facing each other in a symmetrical structure (e.g., the first conductive layer 12 or the auxiliary patterns 12b being symmetrical about a horizontal axis in FIG. 1A). The main pattern 12a may be formed in, for example, a rectangular shape, and the auxiliary patterns 12b may be formed in a rectangular symmetrical structure in which they extend outwardly from each of the two sides of the main pattern 12a. At least one of the auxiliary patterns 12b may be electrically coupled to another device, such as a thin film transistor or a capacitor, through a wiring 12c. A width W2 of the auxiliary pattern 12b is not limited, but may be smaller than a width W1 of the main pattern 12a, or may be equal to a width of the wiring 12c in consideration of the width of the wiring 12c. In addition, a position of the auxiliary pattern 12b is not limited, but may be determined in consideration of a connection relationship with the wiring 12c.

The insulating layer 14 is formed on the substrate 10 and the first conductive layer 12, and the second conductive layer 16 is formed on the insulating layer 14 so as to overlap at least a portion of the main pattern 12a and the auxiliary patterns 12b of the first conductive layer 12.

One of the first conductive layer 12 and second conductive layer 16 may be formed of a semiconductor layer made of doped polysilicon and oxide semiconductor, with the other being formed of a metal layer. For example, the first conductive layer 12 may be formed of the semiconductor layer, and the second conductive layer 16 may be formed of the metal layer, or the first conductive layer 12 may be formed of the metal layer, and the second conductive layer 16 may be formed of the semiconductor layer. The insulating layer 14 may be formed of a dielectric film, such as a silicon oxide film and a silicon nitride film.

When the semiconductor device may be used as the thin film transistor, for example, the first conductive layer 12 may be used as an active layer providing a source region, a drain region, and a channel region, the insulating layer 14 may be used as a gate insulating film, and the second conductive layer 16 may be used as a gate electrode. Alternatively, when the semiconductor device may be used as the capacitor, the first conductive layer 12 may be used as a lower electrode, the insulating layer 14 may be used as a dielectric film, and the second conductive layer 16 may be used as an upper electrode.

In the semiconductor device configured as described above, even though misalignment may occur while forming the second conductive layer 16, electrical characteristics are relatively unchanged.

The first conductive layer 12 and the second conductive layer 16 are patterned through a lithography process and an etching process during a manufacturing process thereof. The lithography process includes an exposure process using a mask, where the mask may be misaligned in a vertical direction, for example, along the Y axis.

Figure 2:
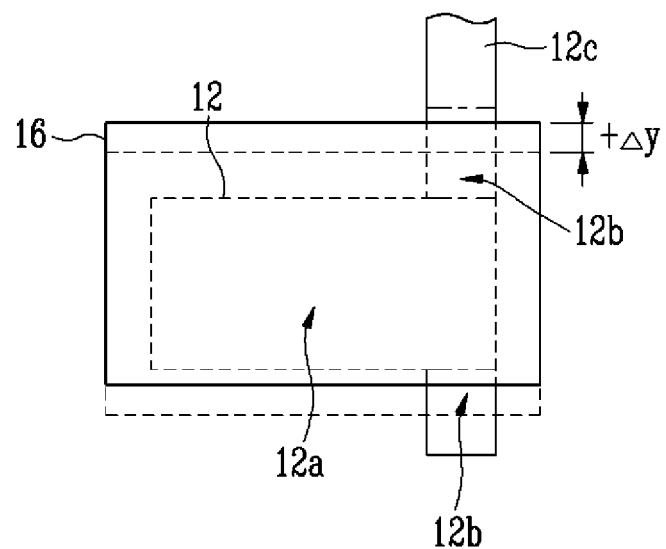
FIGS. 2 and 3 are plan views describing an effect of the semiconductor device according to the exemplary embodiment of the present invention shown in FIGS. 1A and 1B.
Figure 3:
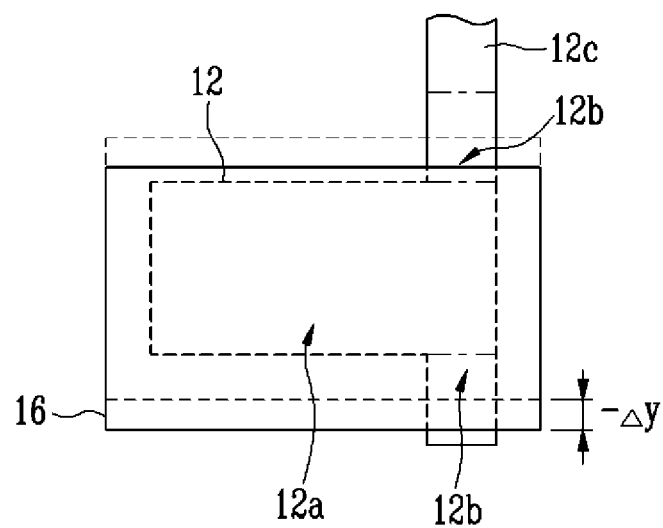

FIG. 2 shows a state in which the second conductive layer 16 is shifted by +Δy along the Y axis (e.g., in an upward direction) due to the misalignment of the mask, and FIG. 3 shows a state in which the second conductive layer 16 is shifted by −Δy along the Y axis (e.g., in a downward direction) due to the misalignment of the mask.

In a structure omitting the auxiliary pattern 12b, that is, in a structure in which the main pattern 12a is electrically coupled to another device through the wiring 12c, when misalignment occurs, as shown in FIG. 2 or FIG. 3, since an area at which the wiring 12c overlaps the second conductive layer 16 increases or decreases, capacitance between the first conductive layer 12 and the second conductive layer 16 is changed. However, according to the present exemplary embodiment, despite the misalignment, because an area at which the first conductive layer 12 overlaps the second conductive layer 16 is almost unchanged by the auxiliary patterns 12b extending from two sides of the main pattern 12a in the symmetrical structure, capacitance is relatively unchanged.

To improve or maximize an effect according to an aspect of the present embodiment, a size and a shape of the auxiliary pattern 12b may be determined in consideration of a foreseeable range of misalignment, wherein the size of the auxiliary pattern 12b may be set to have a sufficiently large size.

Figure 4A:
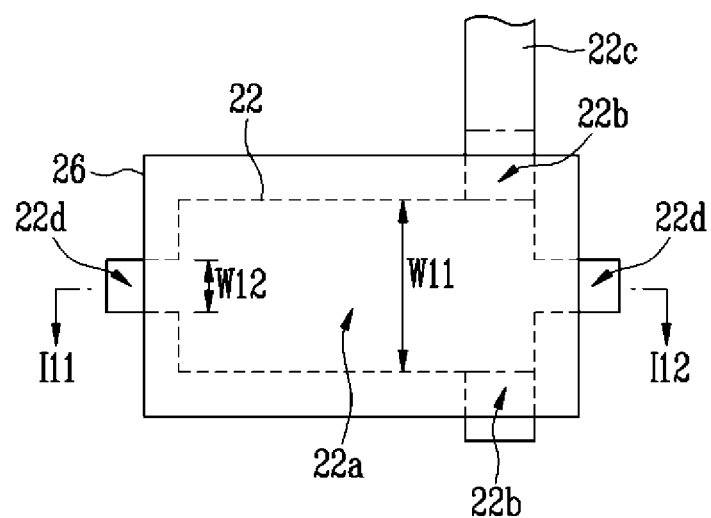
FIG. 4A is a plan view describing a semiconductor device according to another exemplary embodiment of the present invention.
Figure 4B:
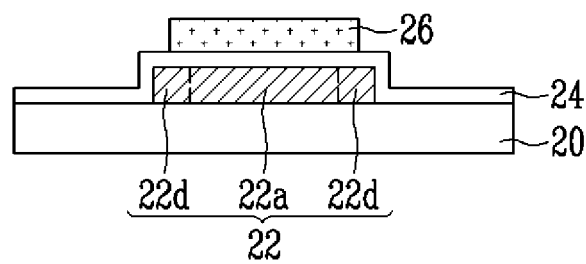
FIG. 4B is a cross-sectional view taken along the line I11-I12 of FIG. 4A.

FIG. 4A is a plan view describing a semiconductor device according to another exemplary embodiment of the present invention, and FIG. 4B is a cross-sectional view taken along the line I11-I12 of FIG. 4A. Referring to FIGS. 4A and 4B, the semiconductor device includes a first conductive layer 22, an insulating layer 24, and a second conductive layer 26.

The first conductive layer 22 is formed on a substrate 20, and includes a main pattern 22a, first auxiliary patterns 22b extended from two opposing sides of the main pattern 22a in a symmetrical structure, and second auxiliary patterns 22d extended from another pair of opposing sides of the main pattern 22a in a symmetrical structure.

The main pattern 22a may be, for example, rectangular, and the first and second auxiliary patterns 22b and 22d may be rectangular and formed in a symmetrical structure in which they extend outwardly from respective pairs of sides of the main pattern 22a. At least one of the first and second auxiliary patterns 22b and 22d may be electrically coupled to another device, such as the thin film transistor or the capacitor, through the wiring 22c. A width W11 of the first auxiliary pattern 22b may be set to be the same as that of the auxiliary pattern 12b of the embodiment shown in FIG. 1A. In addition, a width W12 of the second auxiliary pattern 22d is not limited, but may be smaller than a width W11 of the main pattern 22a, or may be equal to a width of the wiring 22c. Further, a position of the second auxiliary pattern 22d is not limited.

The insulating layer 24 is formed on the substrate 20 and the first conductive layer 22, and the second conductive layer 26 is formed on the insulating layer 24 to overlap at least a portion of the main pattern 22a, the first auxiliary patterns 22b, and the second auxiliary patterns 22d of the first conductive layer 22.

The first conductive layer 22 or the second conductive layer 26 may be formed of a semiconductor layer made of doped polysilicon and oxide semiconductor, while the other may be formed of a metal layer. For example, the first conductive layer 22 may be formed of the semiconductor layer, and the second conductive layer 26 may be formed of the metal layer. Alternatively the first conductive layer 22 may be formed of the metal layer, and the second conductive layer 26 may be formed of the semiconductor layer. The insulating layer 24 may be formed of a dielectric film such as, for example, a silicon oxide film and a silicon nitride film.

When the semiconductor device is used as the thin film transistor, for example, the first conductive layer 22 may be used as an active layer providing a source region, a drain region and a channel region, the insulating layer 24 may be used as a gate insulating film, and the second conductive layer 26 may be used as a gate electrode. Alternatively, when the semiconductor device is used as the capacitor, for example, the first conductive layer 22 may be used as a lower electrode, the insulating layer 24 may be used as a dielectric film, and the second conductive layer 26 may be used as an upper electrode.

In the semiconductor device configured as described above, even though the mask may be misaligned in a horizontal direction, for example, in a direction along the X axis, during a process of forming the second conductive layer 26, electrical characteristics are not changed.

Figure 5:
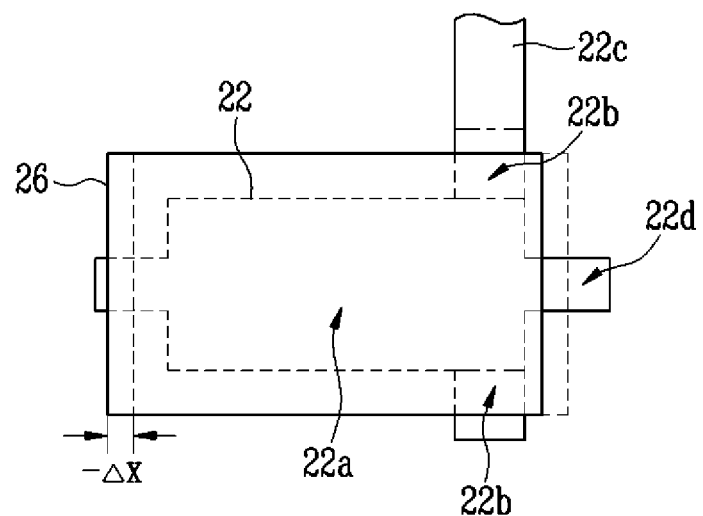
FIGS. 5 and 6 are plan views describing an effect of the semiconductor device according to another exemplary embodiment of the present invention.
Figure 6:
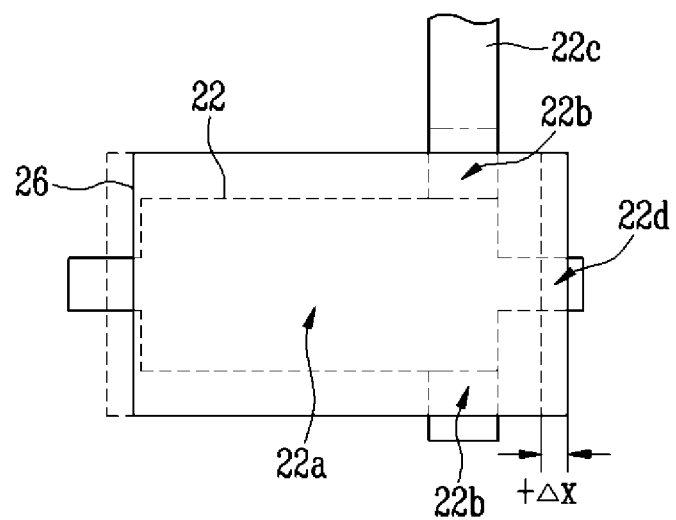

FIG. 5 shows a state in which the second conductive layer 26 is shifted by −Δx along the X axis (e.g., to the left) due to the misalignment of the mask, and FIG. 6 shows a state in which the second conductive layer 26 is shifted by +Δx along the X axis (e.g., to the right) due to the misalignment of the mask.

Despite the misalignment, because an area at which the first conductive layer 22 overlaps the second conductive layer 26 is almost unchanged by the auxiliary patterns 22b extended from two sides of the main pattern 22a in the symmetrical structure, capacitance is relatively unchanged.

Although not described in detail, in the semiconductor device according to the exemplary embodiment of the present invention, even though misalignment may occur in the vertical direction as shown in FIGS. 2 and 3, the area at which the first conductive layer 22 overlaps the second conductive layer 26 is almost unchanged by the first auxiliary patterns 22b extended at two sides of the main pattern 22a in the symmetrical structure. That is, the electrical characteristics of the semiconductor device of FIG. 1A may be relatively unchanged only when the mask is misaligned in the vertical direction (e.g., as opposed to the horizontal direction). However, the semiconductor device of FIG. 4A may achieve an effect even in the case in which the mask is misaligned in the vertical direction and/or the horizontal direction.

To utilize an aspect of the present embodiment, a size and a shape of the first and second auxiliary patterns 22b and 22d may be determined in consideration of a range in which the misalignment may be generated. It is preferable that the size of the first and second auxiliary pattern 22b and 22d are set to have a sufficiently large size.

With the semiconductor device according to the exemplary embodiment of the present invention, even though the misalignment is generated during a process of forming the upper second conductive layer, since the area at which the upper second conductive layer overlaps the lower part of the first conductive layer 22 is unchanged, the electrical characteristics are not changed.

When the semiconductor device according to the present exemplary embodiment is applied to a pixel circuit of a liquid crystal display device or an organic light emitting display device, even though the misalignment is generated during a process of forming a thin film transistor or a storage capacitor, capacitance is relatively unchanged, such that the pixel circuit may be stably driven by a current (e.g., a predetermined amount of current). Therefore, the uniformity of the color is improved, and the spot due to a low gray-scale is avoided, thereby making it possible to improve the quality of the display panel.

While embodiments of the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A semiconductor device comprising:
   a substrate;
   a first conductive layer on the substrate and comprising:
      a main pattern;
      substantially symmetrical first auxiliary patterns extending from two sides of the main pattern and electrically connected to the main pattern; and
      substantially symmetrical second auxiliary patterns extending from two other sides of the main pattern;
   an insulating layer on the substrate and the first conductive layer; and
   a second conductive layer on the insulating layer and overlapping the main pattern and at least a portion of the first auxiliary patterns and the second auxiliary patterns,
   wherein one of the first auxiliary patterns is coupled to a wiring and another of the first auxiliary patterns has an isolated terminal end.

2. The semiconductor device according to claim 1, wherein at least one of the first conductive layer and the second conductive layer comprises a semiconductor layer.

3. The semiconductor device according to claim 1, wherein at least one of the first conductive layer and the second conductive layer comprises a metal layer.

4. The semiconductor device according to claim 1, wherein the semiconductor device comprises a thin film transistor.

5. The semiconductor device according to claim 1, wherein the semiconductor device comprises a capacitor.

6. A semiconductor device comprising:
   a substrate;
   a first conductive layer on the substrate and comprising:
      a main pattern;
      substantially symmetrical first auxiliary patterns extending from two sides of the main pattern and electrically connected to the main pattern; and
      substantially symmetrical second auxiliary patterns extending from two other sides of the main pattern;
   an insulating layer on the substrate and the first conductive layer such that the first conductive layer is between the substrate and the insulating layer; and
   a second conductive layer on the insulating layer and overlapping the main pattern and at least a portion of the first auxiliary patterns and the second auxiliary patterns,
   wherein at least one of the first auxiliary patterns extending from one of the two sides of the main pattern and at least one of the second auxiliary patterns extending from one of the two other sides of the main pattern extends beyond an edge of the second conductive layer.

* * * * *